(12) United States Patent
Kim

(10) Patent No.: US 10,657,209 B2
(45) Date of Patent: May 19, 2020

(54) COMPUTING SYSTEM AND METHOD OF PERFORMING VERIFICATION OF CIRCUIT DESIGN IN THE COMPUTING SYSTEM

(71) Applicant: Samsung Electronics Co., Ltd., Suwon-si, Gyeonggi-do (KR)

(72) Inventor: Ho-young Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 187 days.

(21) Appl. No.: 15/718,305

(22) Filed: Sep. 28, 2017

(65) Prior Publication Data

US 2018/0101632 A1 Apr. 12, 2018

(30) Foreign Application Priority Data

Oct. 12, 2016 (KR) .................. 10-2016-0132146

(51) Int. Cl.
*G06F 17/50* (2006.01)

(52) U.S. Cl.
CPC ................ *G06F 17/5045* (2013.01)

(58) Field of Classification Search
CPC .................................................. G06F 17/5045
USPC ........................................................ 716/102
See application file for complete search history.

(56) References Cited

U.S. PATENT DOCUMENTS

| | | | |
|---|---|---|---|
| 5,537,580 A | 7/1996 | Giomi et al. | |
| 6,691,079 B1 * | 2/2004 | Lai | G01R 31/31835 703/16 |
| 6,996,788 B2 | 2/2006 | Akiba et al. | |
| 7,124,070 B2 | 10/2006 | Takenaka | |
| 8,560,985 B1 * | 10/2013 | Sahu | G06F 17/504 716/106 |
| 8,650,519 B2 | 2/2014 | Boehm | |
| 9,158,874 B1 * | 10/2015 | Ranjan | G06F 17/5022 |
| 9,355,206 B2 | 5/2016 | Ikram et al. | |
| 10,002,218 B2 * | 6/2018 | Ikram | G06F 17/5045 |
| 2005/0102596 A1 * | 5/2005 | Hekmatpour | G01R 31/31835 714/741 |
| 2006/0156261 A1 * | 7/2006 | Farkash | G06F 17/504 716/107 |
| 2013/0019217 A1 * | 1/2013 | Brinkmann | G06F 17/504 716/106 |
| 2014/0215418 A1 * | 7/2014 | Brinkmann | G06F 17/504 716/106 |

FOREIGN PATENT DOCUMENTS

| | | |
|---|---|---|
| JP | 2001014365 A | 1/2001 |
| JP | 2004021841 A | 1/2004 |
| JP | 2008090865 A | 4/2008 |

OTHER PUBLICATIONS

O'Donnell, Jay, "Questa inFact Automated Stimulus Generation," Intelligent Testbench Automation Specialist Design Verification Technology, May 2014, pp. 1-27.

* cited by examiner

*Primary Examiner* — Suchin Parihar
(74) *Attorney, Agent, or Firm* — Harness, Dickey & Pierce, P.L.C.

(57) ABSTRACT

Provided are a method of generating a functional coverage model from a hardware description language (HDL) code for a circuit design and performing verification of the circuit design by using the functional coverage model, and a computing system in which the method is performed.

20 Claims, 7 Drawing Sheets

FIG. 3A

```
                                                          310
bit [1:0] pos;
bit [1:0] out;
always @(*)
begin
      if (in == push) begin
if (pos != 3) begin
                        pos = pos + 1;
                        out = 0;
                  else begin
                        pos = pos;
                        out = overflow;
                  end
            else if (in == pop) begin
                  if (pos != 0) begin
                        pos = pos - 1;
                        out = 0;
                  else begin
                        pos = pos;
                        out = underflow;
                  end
      end
end
```

FIG. 4B

```
                                                          430
cover point { bins valid_tran = (S0 => S1 => S0);}
cover point { bins valid_tran = (S0 => S2 => S0);}
cover point { bins valid_tran = (S0 => S1 => S3);}
cover point { bins valid_tran = (S0 => S2 => S3);}
cover point { bins valid_tran = (S3 => S2 => S3);}
cover point { bins valid_tran = (S3 => S1 => S3);}
cover point { bins valid_tran = (S3 => S2 => S0);}
cover point { bins valid_tran = (S3 => S1 => S0);}

440
cover point { bins valid_tran = (S0 => S1 => S3);}
cover point { bins valid_tran = (S0 => S2 => S3);}
cover point { bins valid_tran = (S3 => S2 => S3);}
cover point { bins valid_tran = (S3 => S1 => S3);}

450
cover point { bins {a,b} = {10,10} }
cover point { bins {a,b} = {10,11} }
cover point { bins {a,b} = {11,10} }
cover point { bins {a,b} = {01,11} }
cover point { bins {a,b} = {11,01} }
cover point { bins {a,b} = {11,11} }
```

COMPUTING SYSTEM AND METHOD OF PERFORMING VERIFICATION OF CIRCUIT DESIGN IN THE COMPUTING SYSTEM

CROSS-REFERENCE TO RELATED APPLICATION

This U.S. non-provisional application claims the benefit of priority under 35 U.S.C. § 119 to Korean Patent Application No. 10-2016-0132146, filed on Oct. 12, 2016, in the Korean Intellectual Property Office (KIPO), the disclosure of which is incorporated herein in its entirety by reference.

BACKGROUND

1. Field

Various example embodiments relate to a computing system, a computing apparatus, non-transitory computer readable medium, and/or a method of performing verification of a circuit design in the computing system.

2. Description of the Related Art

As the complexity of integrated circuits (ICs) increases, an operation of verifying a circuit design becomes increasingly difficult. Accordingly, the verifying operation occupies most of the IC design process time and consumes most of the resources required to perform an entire circuit design process.

Generally, to verify the circuit design several tests are performed based on a simulation of the IC. However, a measurement criterion, such as coverage, may be used to estimate the completeness of such a verification operation. Coverage may be roughly classified into code coverage and functional coverage.

SUMMARY

Provided are computing systems, apparatuses, non-transitory computer readable media, and/or methods of performing verification of a circuit design in the computing systems. Additional aspects will be set forth in part in the description which follows and, in part, will be apparent from the description, or may be learned by practice of the various example embodiments.

According to an aspect of at least one example embodiment, a computing system includes a memory configured to store computer executable instructions; and at least one processor configured to execute the computer executable instructions to receive hardware description language (HDL) code representing a circuit design for verification, generate a functional coverage model from the HDL code, and verify the circuit design based on the functional coverage model.

The at least one processor may convert the HDL code into a formal language model and may generate the functional coverage model from the formal language model.

The HDL code may include a register-transistor-level (RTL) code, and the at least one processor may convert the RTL code into a finite state machine and may generate the functional coverage model from the finite state machine.

The at least one processor may generate the functional coverage model based on at least one state of the finite state machine and at least one state transition condition of the finite state machine.

The computing system may further include a user input unit configured to receive an input for the HDL code from a user; and a display configured to display and output the functional coverage model.

The user input unit mat be further configured to receive from the user an input correcting the functional coverage model, and the at least one processor may perform verification of the circuit design by using the corrected functional coverage model.

The functional coverage model may include a cover point which is a set of specific events; and a cover property which is a set of specific events under specific conditions.

According to an aspect of at least one example embodiment, a method of performing verification of a circuit design is performed by a computing system, the method including generating, using at least one processor, a functional coverage model from hardware description language (HDL) code representing the circuit design, and verifying, using the at least one processor, of the circuit design based on the functional coverage model.

According to an aspect of at least one example embodiment, a non-transitory computer-readable recording medium has recorded thereon computer readable instructions, which, when executed by at least one processor, performs the method.

According to an aspect of at least one example embodiment, a circuit design verification computing system includes a memory having computer readable instructions stored thereon, and at least one processor configured to execute the computer readable instructions to receive hardware description language (HDL) code related to a circuit design, determine at least one state and at least one state transition based on the received HDL code, generate a finite state machine based on the determined at least one state and at least one state transition, generate a functional coverage model based on the generated finite state machine, and verify the circuit design based on the generated functional coverage model and desired outputs of the functional coverage model.

BRIEF DESCRIPTION OF THE DRAWINGS

The foregoing and other features of inventive concepts will be apparent from the more particular description of non-limiting example embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIGS. 3A and 3B illustrate diagrams of a controller configured to generate a functional coverage model from a register-transfer-level (RTL) code according to at least one example embodiment;

FIGS. 4A and 4B illustrate diagrams of a controller configured to generate a functional coverage model from an RTL code according to at least one example embodiment;

DETAILED DESCRIPTION

Figure 1:
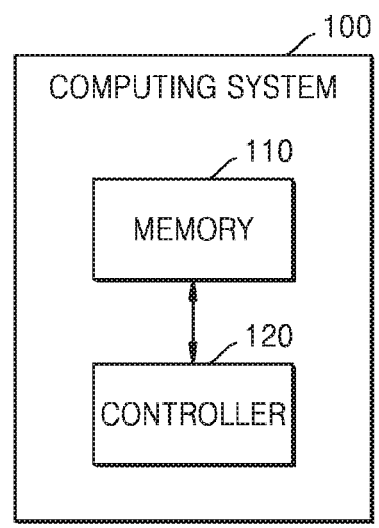
FIG. 1 is a block diagram of a computing system according to at least one example embodiment.

Various example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

Throughout the specification, when an element is referred to as being "connected" or "coupled" to another element, it can be directly connected or coupled to the other element, or can be connected or coupled to the other element with intervening elements interposed therebetween. In addition, the terms "comprises" and/or "comprising" or "includes" and/or "including" when used in this specification, specify the presence of stated elements, but do not preclude the presence or addition of one or more other elements.

While such terms as "first", "second", etc., may be used to describe various components, such components must not be limited to the above terms. The above terms are used only to distinguish one component from another.

Examples of a computer system may include a laptop computer, a desktop computer, a notebook computer, a tablet computer, a smartphone, a personal digital assistant (PDA), a wearable device, a smart device, an Internet of Things (IoT) device, a gaming console, a virtual reality device, an augmented reality device, or the like, but the computer system is not limited thereto.

FIG. 1 is a block diagram of a computing system 100 according to at least one example embodiment.

The computing system 100 may include at least a memory 110 and at least one controller 120, but the example embodiments are not limited thereto and the computing system 100 may include other constituent elements as well.

The memory 110 may store a program for processing and control by the controller 120, or may store at least one computer executable instruction. For example, the computer executable instruction may be expressed in, for example, 8 bits, 16 bits, 32 bits, 64 bits, 128 bits, etc.

The controller 120 controls all operations of the computing system 100. The controller 120 may include at least one processor. In other words, the controller 120 may include a plurality of processors or a single integrated processor, according to a function and a role thereof. Additionally, the controller 120 may be a distributed processing system, a cloud processing system, etc.

The controller 120 may generate a functional coverage model of an electronic circuit and/or integrated circuit (IC) from hardware description language (HDL) code for a circuit design by executing the computer executable instructions stored in the memory 110. In more detail, the controller 120 may convert the HDL code into a formal language model of the circuit design and may automatically generate the functional coverage model from the formal language model.

An HDL is a computer language for designing a structure and a function of an electronic circuit and/or a digital logic circuit at a low level (e.g., at the electronic components and/or logic gate level). Examples of the HDL may include Verilog or VHSIC hardware description language (VHDL), etc. According to at least one example embodiment, the HDL code may include a register-transfer-level (RTL) code, a Gate-Level code, a netlist code, or the like. In the following example embodiments, RTL code is illustrated as an example of the HDL code. However, it will be understood by one of ordinary skill in the art that other types of HDL codes are similarly applicable to the example embodiments and that the example embodiments are not limited to use with RTL code.

A formal programming language expresses a set of character strings as having a particular rule that is implemented based on various inputs, conditions, etc., and may provide functionality and/or a desired output based on the particular rule. Examples of the formal language model may include a finite state machine, a Petri Net, etc. In the following example embodiments, a finite state machine will be described as an example of the formal language model. However, it will be understood by one of ordinary skill in the art that other types of formal language models are also applicable to the example embodiments.

The functional coverage model may serve as a measurement criterion for estimating the completeness of the verification of a circuit design. Accordingly, the functional coverage model may be a set of functions (e.g., a plurality of functions) that may occur and/or be performed on a circuit that is designed from the HDL code. In other words, the functional coverage model may provide a model of the functionality of the circuit design based on desired inputs by modeling the theoretical and/or anticipated outputs of the circuit design based on the inputs and the HDL code. According to at least one example embodiment, the controller 120 may generate the functional coverage model by modeling at least one occurrence of a specific event as a function. For example, the occurrence of the specific event may be the generation of a specific input value and/or a specific output value. The controller 120 may generate the functional coverage model by modeling, as a function, the occurrence of a specific event under specific conditions. Accordingly, the functional coverage model may include at least one cover point, which is a set of specific events, and at least one cover property, which is a set of specific events under specific conditions, wherein the cover points and the cover properties are determined based on analysis of the HDL code, such as identification and analysis of functions included in the HDL code, inputs and outputs of the functions and/or HDL code, data operations, mathematical operations, conditional loops and/or logic included in the HDL code, etc., in order to determine the cover points and/or cover properties of the functional coverage model representative of the HDL code.

According to at least one example embodiment, the controller 120 may convert RTL code for a circuit design into a finite state machine by executing the computer executable instructions stored in the memory 110. The finite state machine refers to a calculation model including a finite number of states and transitions among the states. The transitions among the states may include one or more transition conditions that may trigger the transition from a first state to a different state.

Then, the controller 120 may generate the functional coverage model from and/or based on the finite state machine. For example, the controller 120 may generate the functional coverage model based on the states of the finite state machine and state transition conditions thereof. In other words, the controller 120 may generate a functional coverage model which is a set of events that may occur within the finite state machine.

Figure 2:
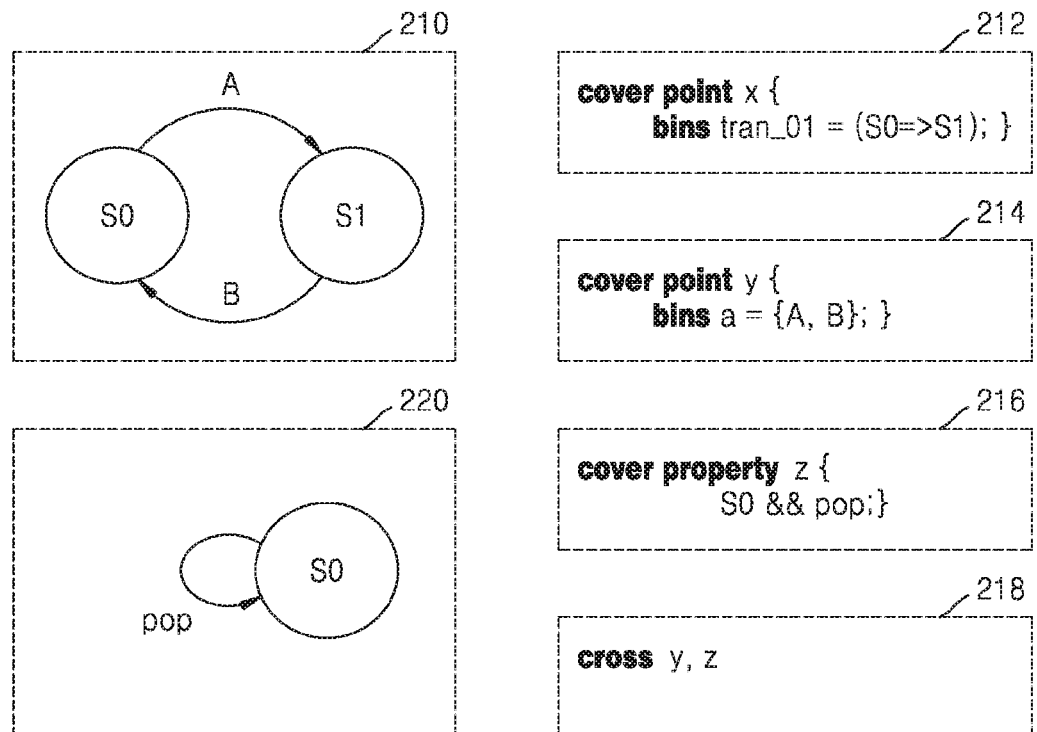
FIG. 2 illustrates diagrams of a controller configured to generate a functional coverage model from a finite state machine according to at least one example embodiment.

FIG. 2 illustrates at least one example embodiment in which a controller generates a functional coverage model from a finite state machine.

The controller 120 may generate a functional coverage model 212 from a finite state machine 210 based on the states and transition conditions of the finite state machine. For example, in finite state machine 210, because a state S0 transitions to a state S1 under a transition condition A in the finite state machine 210, the controller 120 may generate a cover point x, which is a functional coverage model, by modeling the occurrence of the event in which the state S0 transitions to state S1.

The controller 120 may also generate a functional coverage model 214 from the finite state machine 210. For example, in finite state machine 210, because the state S0 transitions to the state S1 under the transition condition, A and the state S1 transitions to the state S0 under a transition condition B within the finite state machine 210, the controller 120 may generate a cover point y, which is a functional coverage model, by modeling the event in which the transition condition A or B occurs.

The controller 120 may also generate a functional coverage model 216 from a finite state machine 220. For example, in finite state machine 220, because the state S0 is maintained due to an occurrence of a pop action in the finite state machine 220, the controller 120 may generate a cover property z, which is a functional coverage model, by modeling the event in which a pop action occurs under a condition such as the state S0.

The controller 120 may also generate a functional coverage model 218 from the finite state machines 210 and 220. For example, the controller 120 may generate a functional coverage model 218 for measuring whether the cover point y and the cover property z are simultaneously generated. However, the example embodiments are not limited to the finite state machines shown in FIG. 2, and functional coverage models may be generated for any type of finite state machine.

Figure 3B:
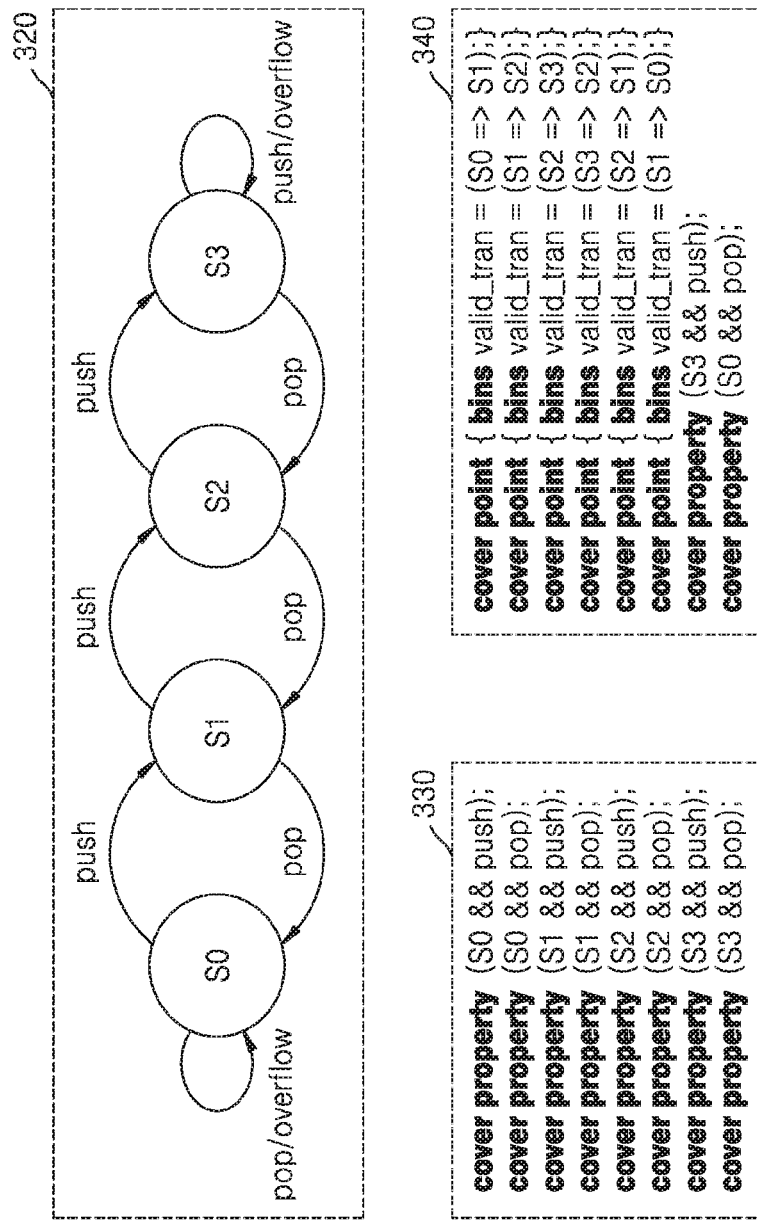

FIGS. 3A and 3B illustrate at least one example embodiment in which a controller generates a functional coverage model from an RTL code.

FIG. 3A illustrates an RTL code 310 for a queue having three entries. According to at least one embodiment, the computing system 100 of FIG. 1 may receive the RTL code 310 from a user.

The controller 120 of FIG. 1 may convert the RTL code 310 of FIG. 3A into a finite state machine 320 of FIG. 3B. For example, the controller 120 may generate a finite state machine 320 that has a state S0 representing an empty state and a state S1, a state S2, and a state S3 respectively representing the three entries and in which state transitions occur due to push actions and pop actions, based on the RTL code 310. In other words, the controller 120 may analyze the RTL code 310 in order to determine various states, conditions, logic operations, mathematical operations, conditional operations, functions, inputs, outputs, etc., included in the RTL code and then generate a finite state machine based on the analysis of the RTL code.

According to at least one example embodiment, the controller 120 may generate a functional coverage model 330 from the generated finite state machine 320.

For example, the controller 120 may generate the functional coverage model 330, which includes eight cover properties, as a functional coverage model for events that may occur within the finite state machine 320, based on the states of the finite state machine 320 and the state transition conditions thereof. In other words, the controller 120 may generate a functional coverage model 330 representing the various events included in the finite state machine 320, such as an event in which a push action occurs under a condition when the finite state machine is in state S0, an event in which a pop action occurs under a condition when the finite state machine is in the state S0, an event in which a push action occurs under a condition when the finite state machine is in the state S1, an event in which a pop action occurs under a condition when the finite state machine is in the state S1, an event in which a push action occurs under a condition when the finite state machine is in the state S2, an event in which a pop action occurs under a condition when the finite state machine is in the state S2, an event in which a push action occurs under a condition when the finite state machine is in the state S3, and an event in which a pop action occurs under a condition when the finite state machine is in the state S3, etc. However, the example embodiments are not limited thereto and the finite state machine may include other events and/or operations besides push/pop actions, such as shift operations, rotate operations, load operations, jump operations, Boolean operations, mathematical operations, logical operations, relational operations, conditional operations, etc.

According to at least one other example embodiment, the controller 120 may generate a functional coverage model 340 from the finite state machine 320.

For example, the controller 120 may generate a functional coverage model 340, which includes six cover points and two cover properties, as a functional coverage model for events that may occur within the finite state machine 320, based on the states of the finite state machine 320 and the state transition conditions thereof. In other words, the controller 120 may generate a functional coverage model 340 representing an event in which the state S0 transitions to the state S1, an event in which the state S1 transitions to the state S2, an event in which the state S2 transitions to the state S3, an event in which the state S3 transitions to the state S2, an event in which the state S2 transitions to the state S1, an event in which the state s1 transitions to the state S0, an event in which a push action occurs under a condition such as the state S3, and an event in which a pop action occurs under a condition such as the state S0, etc.

Figure 4A:
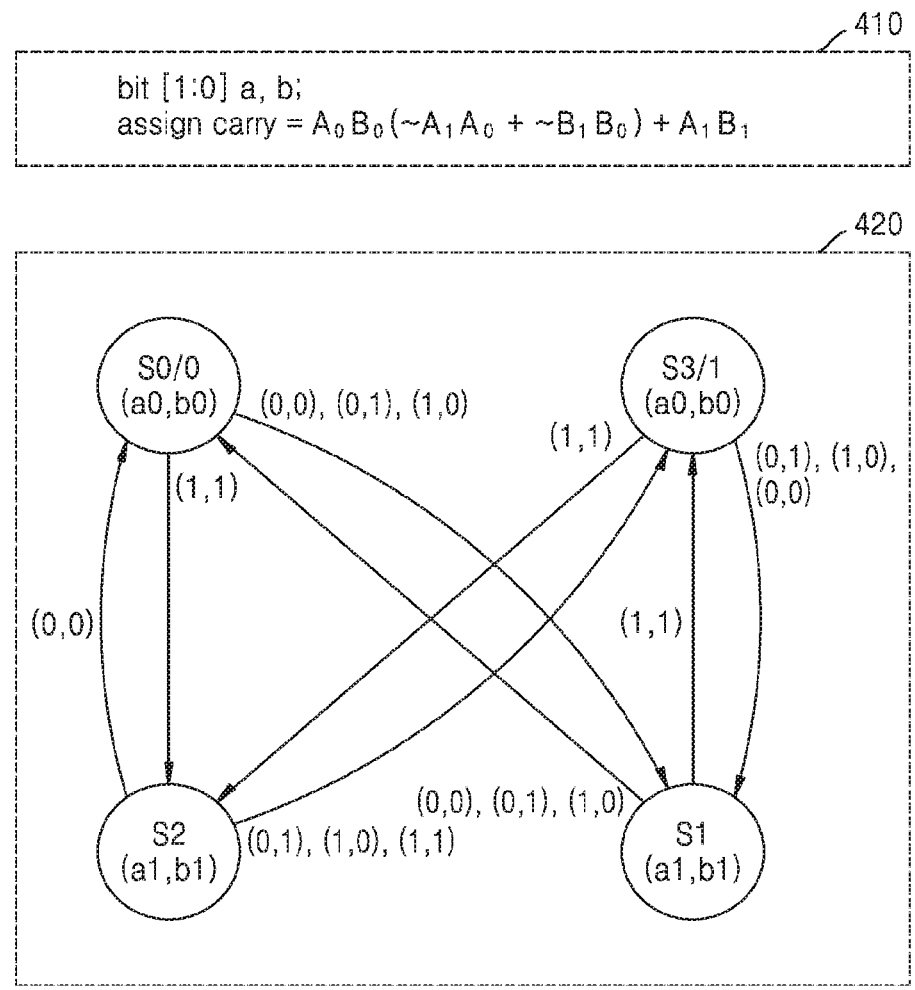

FIGS. 4A and 4B illustrate at least one other example embodiment in which a controller generates a functional coverage model from an RTL code.

RTL code 410 represents a carry in a 2 bit adder. In other words, the RTL code 410 represents a case where a carry is generated during an addition operation between variables a and b, each variable having 2 bits, but the example embodiments are not limited thereto. According to at least one example embodiment, the computing system 100 of FIG. 1 may receive the RTL code 410 from a user and/or some other source.

The controller 120 of FIG. 1 may convert the RTL code 410 into a finite state machine 420. For example, the controller 120 may generate a finite state machine 420 that has a state S0, in which no carries are generated, a state S3, in which a carry is generated, and states S1 and S2 corresponding to intermediate states, and in which state transitions occur for each of an upper bit (e.g., a1,b1) and a lower bit (e.g., a0,b0) among the 2 bits, based on the RTL code 410.

According to at least one example embodiment, the controller 120 may generate a functional coverage model 430 from the finite state machine 420.

For example, the controller 120 may generate the functional coverage model 430, which includes eight cover points, as a functional coverage model for events that may occur within the finite state machine 420 based on the states of the finite state machine 420 and the state transition conditions thereof. In other words, the controller 120 may generate a functional coverage model 430 representing a plurality of events of the finite state machine, such as an event in which a state S0 transitions to a state S1 and returns to the state S0, an event in which the state S0 transitions to a state S2 and returns to the state S0, an event in which the state S0 transitions to the state S1 and then to a state S3, an event in which the state S0 transitions to the state S2 and then to the state S3, an event in which the state S3 transitions to the state S1 and then to the state S0, an event in which the state S3 transitions to the state S2 and then to the state S0, an event in which the state S3 transitions to the state S1 and then to the state S3, and an event in which the state S3 transitions to the state S2 and then to the state S3, etc.

According to at least one example embodiment, the controller 120 may generate a functional coverage model 440 from the finite state machine 420.

For example, the controller 120 may generate the functional coverage model 440, which includes four cover points, as a functional coverage model for events in which a carry occurs within the finite state machine 420 based on the states of the finite state machine 420 and the state transition conditions thereof. In other words, the controller 120 may generate a functional coverage model 440 representing an event in which the state S0 transitions to the state S1 and then to the state S3, an event in which the state S0 transitions to the state S2 and then to the state S3, an event in which the state S3 transitions to the state S1 and then to the state S3, and an event in which the state S3 transitions to the state S2 and returns to the state S3, etc.

According to at least one example embodiment, the controller 120 may generate a functional coverage model 450 from the finite state machine 420.

For example, the controller 120 may generate the functional coverage model 450, which includes six cover points, as a functional coverage model for events in which a carry occurs within the finite state machine 420 based on the states of the finite state machine 420 and the state transition conditions thereof. In other words, the controller 120 may generate a functional coverage model 450 representing events of the finite state machine 420, such as an event in which respective input values for the variables a and b are 10 and 10, an event in which the respective input values for the variables a and b are 10 and 11, an event in which the respective input values for the variables a and b are 11 and 10, an event in which the respective input values for the variables a and b are 01 and 11, an event in which the respective input values for the variables a and b are 11 and 01, and an event in which the respective input values for the variables a and b are 11 and 11, etc.

Referring back to FIG. 1, the controller 120 may verify a circuit design by using the generated functional coverage model by executing the computer executable instructions stored in the memory 110. In more detail, the controller 120 may determine the level of the verification of the circuit design via the generated functional coverage model during the verification process of the circuit design. The verification process may include designing and executing test cases for the circuit design to determine whether the circuit design will function as required and/or expected prior to the fabrication of circuits from the circuit design. For example, the controller 120 may perform a verification of a circuit design by performing a simulation for an RTL code based on a test bench, and may determine the level of the verification by measuring, as a desired value, how frequently a functional coverage model was generated as a result of the simulation. As another example, the controller 120 may perform a verification of a circuit design via a formal analysis and may determine the level of the verification by measuring the generated functional coverage model during the verification of the circuit design.

Accordingly, since the computing system 100 may automatically generate the functional coverage model from the HDL code, such as, an RTL code, the functional coverage model may be generated in a smaller time period, and with reduced manpower efforts and/or processing power efforts. In other words, in the conventional art, much time, much resources, and much effort are required because a user (e.g., human operator) has to directly describe (e.g., create by hand) a functional coverage model. However, according to at least one example embodiment, this problem may be addressed by the computing system 100 that is configured to automatically generate the functional coverage model from the HDL code. In addition, in the conventional art, a user directly creates an HDL code and a functional coverage model according to an architecture specification (e.g., IC design specification, processor design API, etc.), and thus mismatch between the HDL code and the architecture specification and/or a wrong description (e.g., errors) of the functional coverage model occurs due to the user's mistake. However, according to at least one example embodiment, this problem may be addressed by the computing system automatically generating the functional coverage model from the HDL code.

Figure 5:
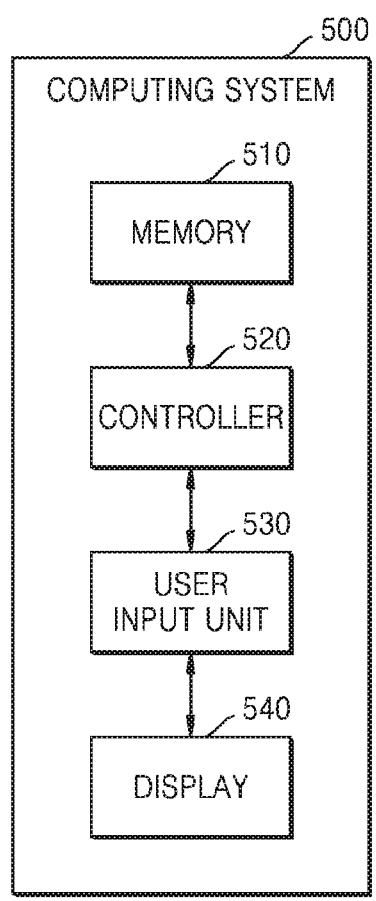
FIG. 5 is a block diagram of a computing system according to at least one example embodiment.

FIG. 5 is a block diagram of a computing system 500 according to at least one example embodiment.

The computing system 500 may include a memory 510, a controller 520, a user input unit 530, and a display 540, but the example embodiments are not limited thereto and may include a lesser or greater number of constituent elements. It will be understood by one of ordinary skill in the art that other computing components may be further included, and/or that the illustrated components in FIG. 5 may be combined and/or replaced.

Since the memory 510 and the controller 520 correspond to the memory 110 and the controller 120 of FIG. 1, a repeated description thereof will be omitted.

The user input unit 530 (e.g., input/output (I/O) device) may receive HDL code for a circuit design from a user. In other words, the user may create the HDL code to design a circuit according to an intended architecture specification, processor design, IC design, etc., and may input the created HDL code to the computing system 500 via the user input unit 530. For example, the user input unit 530 may be, but is not limited to, a keyboard, a mouse, a key pad, a touch pad (e.g., a capacitive overlay type, a resistive overlay type, an infrared beam type, a surface acoustic wave type, an integral strain gauge type, or a piezo electric type, etc.), a microphone, a touchpanel, etc.

The controller 520 may generate a functional coverage model from the received HDL code based on an analysis of the received HDL code.

The display 540 (e.g., display device) may display the generated functional coverage model. In other words, the display 540 may output and provide the generated functional coverage model to the user. The display 540 may include at least one of a liquid crystal display (LCD), a thin film transistor-liquid crystal display (TFT-LCD), an organic light-emitting diode (OLED), a flexible display, a 3D display, and an electrophoretic display, etc.

The user input unit 530 may receive from the user an input of correcting the generated functional coverage model. In other words, the user may check whether the output functional coverage model is appropriate, correct, bug-free, etc. When a portion of the functional coverage model needs to be corrected, the user may correct (e.g., partially correct) the functional coverage model via the user input unit 530.

Then, the controller 520 may verify the circuit design by using a corrected functional coverage model obtained by the user.

Accordingly, the computing system 500 may provide the functional coverage model generated from the HDL code to the user and may verity the circuit design by using the corrected functional coverage model obtained by the user.

Figure 6:
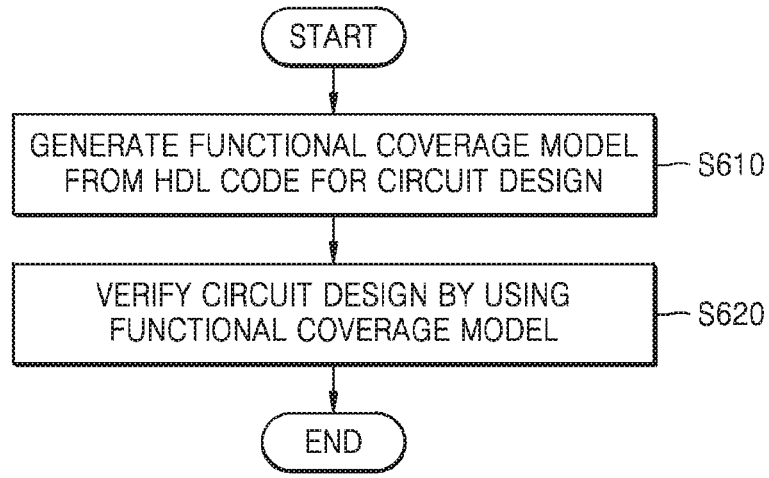
FIG. 6 is a block diagram of a method of performing verification of a circuit design in a computing system, according to at least one example embodiment.

FIG. 6 is a block diagram of a method of performing verification of a circuit design in a computing system, according to at least one example embodiment.

The method of FIG. 6 may be performed by the components of each of the computing systems 100 and 500 of FIGS. 1 and 5, but is not limited thereto, and a redundant description thereof will be omitted here.

In operation S610, each of the computing systems 100 and 500 may generate a functional coverage model from an HDL code for a circuit design. In more detail, each of the computing systems 100 and 500 may convert the HDL code into a formal language model and may automatically generate the functional coverage model from the formal language model.

According to at least one example embodiment, each of the computing systems 100 and 500 may convert RTL code for the circuit design into a finite state machine. Then, each of the computing systems 100 and 500 may generate the functional coverage model from the finite state machine. In detail, each of the computing systems 100 and 500 may generate the functional coverage model based on one or more states of the finite state machine and one or more state transition conditions thereof. In other words, each of the computing systems 100 and 500 may generate a functional coverage model which is a set of events that may occur within the finite state machine.

In operation S620, each of the computing systems 100 and 500 may verify the circuit design by using the functional coverage model. In more detail, each of the computing systems 100 and 500 may determine the level of the verification of the circuit design via the generated functional coverage model during the verification of the circuit design.

Figure 7:
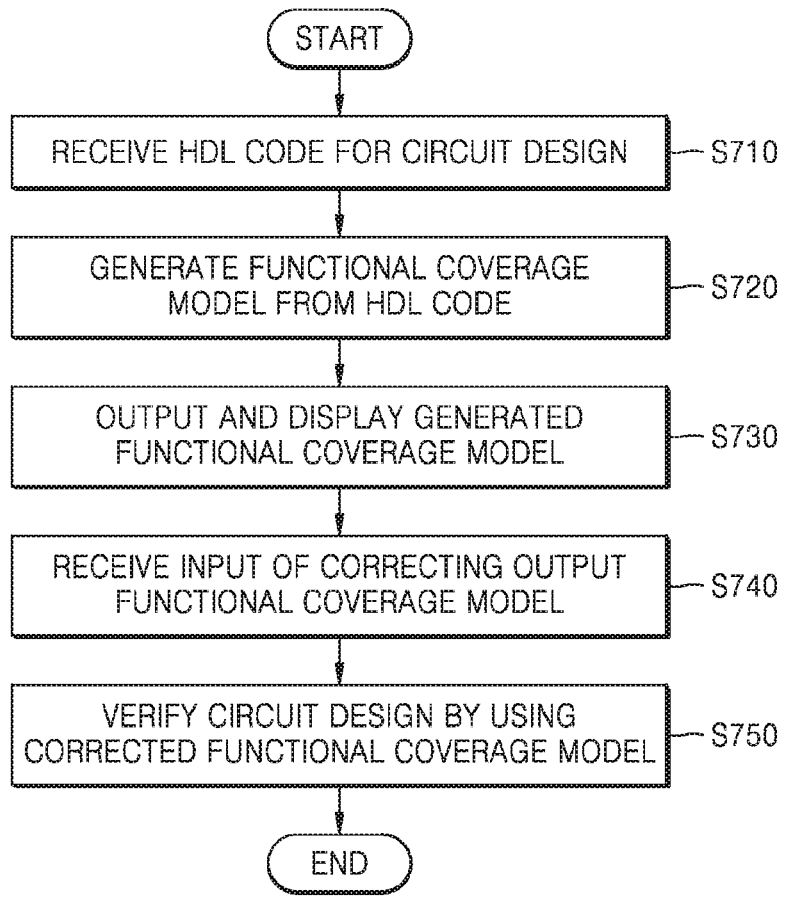
FIG. 7 is a block diagram of a method of performing verification of a circuit design in a computing system, according to at least one example embodiment.

FIG. 7 is a block diagram of a method of performing verification of a circuit design in a computing system according to at least one example embodiment.

The method of FIG. 7 may be performed by the components of each of the computing systems 100 and 500 of FIGS. 1 and 5, but is not limited thereto, and a redundant description thereof will be omitted here.

In operation S710, each of the computing systems 100 and 500 may receive HDL code for at least one circuit design. In other words, a user may create the HDL code to design a circuit according to an intended architecture specification, processor design, IC design, etc., and may input the created HDL code to the computing system 500.

In operation S720, each of the computing systems 100 and 500 may generate a functional coverage model from the HDL code input in operation S710.

In operation S730, each of the computing systems 100 and 500 may output and display the generated functional coverage model. In other words, each of the computing systems 100 and 500 may output and provide the generated functional coverage model to the user.

In operation S740, each of the computing systems 100 and 500 may receive an input of correcting the output functional coverage model from a user and/or other external source. In other words, the user may check whether the output functional coverage model is appropriate, correct, bug-free, etc. When a portion of the functional coverage model needs to be corrected, each of the computing systems 100 and 500 may receive an input of correcting (e.g., partially correcting) the functional coverage model by the user. Additionally, the user may input an alternate RTL code and/or functional coverage model, if appropriate.

In operation S750, each of the computing systems 100 and 500 may verify the circuit design by using a corrected functional coverage model obtained by the user.

According to some example embodiments, since a functional coverage model may be automatically generated from a hardware description language (HDL) code, the functional coverage model may be generated in a reduced time period and with reduced efforts and/or reduced resources expended. In other words, in the conventional art, much time, much resources, and much effort are required because a user has to directly describe a functional coverage model. However, according to various example embodiments, this problem may be addressed by automatically generating the functional coverage model from the HDL code.

In addition, in the conventional art, a user directly creates an HDL code and a functional coverage model according to an architecture specification, and thus a problem (e.g., error, bug, etc.) may be introduced due to a user's mistake, such as mismatch between the HDL code and the architecture specification and/or the wrong description of the functional coverage model. However, according to various example embodiments, this problem may be addressed by automatically generating the functional coverage model from the HDL code and there may be a decrease in the errors introduced in the creation of a functional coverage model during the verification process.

Moreover, according to various example embodiments, the functional coverage model generated from the HDL code may be provided to a user and a circuit design represented by the HDL code may be verified by using a functional coverage model corrected by the user.

The computing systems 100 and 500 described herein may comprise at least one processor, a memory for storing program data (e.g., computer readable instructions) and executing the program data, a non-transitory permanent storage unit such as a disk drive, solid state drive, etc., a communications port for handling communications with external devices, and user interface devices, including a touch panel, keyboards, buttons, mice, microphones, cameras, etc. When software modules or algorithms are involved, these software modules may be stored as program instructions or computer readable codes executable on at least one processor on a non-transitory computer-readable recording medium. Examples of the non-transitory computer-readable recording medium include magnetic storage media (e.g., read-only memory (ROM), random-access memory (RAM), floppy disks, hard disks, etc.), and optical recording media (e.g., CD-ROMs, Digital Versatile Discs (DVDs), Blu-ray discs, etc.). The non-transitory computer readable recording medium can also be distributed over network coupled computer systems so that the computer readable code is stored and executed in a distributive manner. This media can be read by the computer, stored in the memory, and executed by at least one processor.

Various example embodiments of the inventive concepts may be described in terms of functional block components and various processing steps. Such functional blocks may be realized by any number of hardware components and/or hardware combined with software components configured to perform the specified functions. For example, various example embodiments may employ various integrated circuit (IC) components, e.g., memory elements, processing elements, logic elements, look-up tables, and the like, which may carry out a variety of functions under the control of one or more microprocessors or other control devices. Similarly, where the elements are described as using software programming and/or software elements, the various example embodiments described herein may be implemented with any programming or scripting language such as C, C++, Java, assembler language, or the like, with the various algorithms being implemented with any combination of data structures, objects, processes, routines or other programming elements. Functional aspects may be implemented in algorithms that are executed on one or more processors. Furthermore, the example embodiments described herein could employ any number of conventional techniques for electronics configuration, signal processing and/or control, data processing and the like. The words "mechanism," "element," "means," and "configuration" are used broadly and are not limited to mechanical or physical embodiments, but can include software routines in conjunction with processors, etc.

The particular implementations shown and described herein are illustrative examples and are not intended to otherwise limit the scope of the example embodiments in any way. For the sake of brevity, conventional electronics, control systems, software development and other functional aspects of the systems may not be described in detail. Furthermore, the connecting lines, or connectors shown in the various figures presented are intended to represent example functional relationships and/or physical or logical couplings between the various elements. It should be noted that many alternative or additional functional relationships, physical connections or logical connections may be present in a practical apparatus.

The use of the terms "a" and "an" and "the" and similar referents in the context of describing the present invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Also, the steps of all methods described herein can be performed in any suitable order unless otherwise indicated herein or otherwise clearly contradicted by context. The example embodiments are not limited to the described order of the steps. The use of any and all examples, or example language (e.g., "such as") provided herein, is intended merely to better illuminate the inventive concepts and does not pose a limitation on the scope of the inventive concepts unless otherwise claimed. Numerous modifications and adaptations will be readily apparent to one of ordinary skill in the art without departing from the spirit and scope.

What is claimed is:

1. A computing system comprising:
an input/output (I/O) device configured to receive an input from a user; and
a memory configured to store computer executable instructions; and
at least one processor configured to execute the computer executable instructions to,
receive the input from the user, the input including hardware description language (HDL) code representing a circuit design for verification,
generate a functional coverage model from the HDL code, and
verify the circuit design based on the functional coverage model, the verifying the circuit design including simulating the circuit design using the HDL code, and measuring how frequently the functional coverage model is generated as a result of the simulating the circuit design to determine a level of the circuit design verification; and
the I/O device is further configured to receive from the user a second input correcting the functional coverage model, the second input including alternate HDL code.

2. The computing system of claim 1, wherein the at least one processor is further configured to:
convert the HDL code into a formal language model; and
generate the functional coverage model from the formal language model.

3. The computing system of claim 1, wherein
the HDL code comprises register-transistor-level (RTL) code; and
the at least one processor is configured to,
convert the RTL code into a finite state machine, and
generate the functional coverage model from the finite state machine.

4. The computing system of claim 3, wherein the at least one processor is configured to generate the functional coverage model based on at least one state of the finite state machine and at least one state transition condition of the finite state machine.

5. The computing system of claim 1, further comprising:
a display device configured to output the functional coverage model.

6. The computing system of claim 5, wherein
the at least one processor is configured to verify the circuit design based on the corrected functional coverage model.

7. The computing system of claim 1, wherein the functional coverage model comprises:
a cover point, the cover point including a set of desired events; and
a cover property, the cover property including a set of desired events under desired conditions.

8. A method, performed by a computing system, of performing verification of a circuit design, the method comprising:
receiving, using at least one processor, hardware description language (HDL) code representing a circuit design for verification;
generating, using the at least one processor, a functional coverage model from the HDL code;
verifying, using the at least one processor, the circuit design based on the functional coverage model, the verifying the circuit design including simulating the circuit design using the HDL code, and measuring how frequently the functional coverage model is generated as a result of the simulating the circuit design to determine a level of the circuit design verification; and receiving, using the at least one processor, a user input correcting the functional coverage model based on alternate HDL code.

9. The method of claim 8, wherein the generating of the functional coverage model comprises:

converting the HDL code into a formal language model; and generating the functional coverage model from the formal language model.

10. The method of claim 8, wherein the HDL code comprises a register-transistor-level (RTL) code; and the generating of the functional coverage model comprises, converting the RTL code into a finite state machine, and generating the functional coverage model from the finite state machine.

11. The method of claim 10, wherein the generating of the functional coverage model further comprises:

generating the functional coverage model based on at least one state of the finite state machine and at least one state transition condition of the finite state machine.

12. The method of claim 8, further comprising:

receiving, using the at least one processor, an input for the HDL code from a user; and displaying, using at least one processor, the functional coverage model on a display device.

13. The method of claim 12, wherein the verifying comprises verifying the circuit design based on the corrected functional coverage model.

14. The method of claim 8, wherein the functional coverage model comprises:

a cover point, the cover point including a set of desired events; and a cover property, the cover property including a set of desired events under desired conditions.

15. A non-transitory computer-readable recording medium having computer readable instructions stored thereon, which, when executed by at least one processor, performs the method of claim 8.

16. A circuit design verification computing system comprising:

a memory having computer readable instructions stored thereon; and at least one processor configured to execute the computer readable instructions to, receive hardware description language (HDL) code related to a circuit design, determine at least one state and at least one state transition based on the received HDL code, generate a finite state machine based on the determined at least one state and at least one state transition, generate a functional coverage model based on the generated finite state machine, verify the circuit design based on the generated functional coverage model and desired outputs of the functional coverage model, the verifying the circuit design including simulating the circuit design using the received HDL code, and measuring how frequently the functional coverage model is generated as a result of the simulating the circuit design to determine a level of the circuit design verification, and receive a user input correcting the functional coverage model based on alternate HDL code.

17. The circuit design verification computing system of claim 16, wherein the HDL code is register-transistor-level (RTL) code; and the determining the at least one state and the at least one state transition includes, identifying inputs, outputs, and logical operations of the RTL code, and determining the at least one state and the at least one state transition based on the identified inputs, outputs, and logical operations.

18. The circuit design verification computing system of claim 16, wherein the functional coverage model includes at least one of a cover point and a cover property, the cover point including a set of desired events; and the cover property including a set of desired events under desired conditions.

19. The circuit design verification computing system of claim 16, wherein the at least one processor is further configured to:

display the generated functional coverage model on a display device; and receive the corrections to the generated functional coverage model via at least one user input device.

20. The circuit design verification computing system of claim 16, wherein the HDL code is one of Gate-Level code or netlist code.

* * * * *